US009496476B2

(12) United States Patent
Maeshima et al.

(10) Patent No.: US 9,496,476 B2
(45) Date of Patent: Nov. 15, 2016

(54) THERMOELECTRIC CONVERSION MODULE

(71) Applicant: Panasonic Intellectual Property Management Co., Ltd., Osaka (JP)

(72) Inventors: Satoshi Maeshima, Hyogo (JP); Kaori Toyoda, Hyogo (JP); Takaaki Higashida, Osaka (JP); Kazunori Kurumaya, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 58 days.

(21) Appl. No.: 14/418,654

(22) PCT Filed: Mar. 17, 2014

(86) PCT No.: PCT/JP2014/001513
§ 371 (c)(1),
(2) Date: Jan. 30, 2015

(87) PCT Pub. No.: WO2014/199541
PCT Pub. Date: Dec. 18, 2014

(65) Prior Publication Data
US 2015/0179912 A1  Jun. 25, 2015

(30) Foreign Application Priority Data

Jun. 11, 2013  (JP) ................................ 2013-122767

(51) Int. Cl.
*H01L 35/32* (2006.01)
*H01L 35/08* (2006.01)
*H01L 35/30* (2006.01)
*H01L 35/16* (2006.01)

(52) U.S. Cl.
CPC ............... *H01L 35/32* (2013.01); *H01L 35/08* (2013.01); *H01L 35/16* (2013.01); *H01L 35/30* (2013.01)

(58) Field of Classification Search
None
See application file for complete search history.

(56) References Cited

U.S. PATENT DOCUMENTS 5,441,576 A  8/1995 Bierschenk et al.
6,252,154 B1  6/2001 Kamada et al.
(Continued)

FOREIGN PATENT DOCUMENTS

CN  101136450  3/2008
JP  GB 2259060 A  *  3/1993  ............. C03C 15/00
(Continued)

OTHER PUBLICATIONS

Machine translation of Tokutome et al. (JP 2012-231025).*
(Continued)

*Primary Examiner* — Magali P Slawski
(74) *Attorney, Agent, or Firm* — Wenderoth, Lind & Ponack, L.L.P.

(57) ABSTRACT

A thermoelectric conversion module includes p-type and n-type thermoelectric conversion elements arranged between two stacked substrates. The p-type and n-type thermoelectric conversion elements include columnar p-type and n-type thermoelectric conversion portions, insulators provided in side surfaces of the p-type and n-type thermoelectric conversion portions, and diffusion preventing films provided on top surface, the top surface different from the side surface of the p-type and n-type thermoelectric conversion portions. Each stacked substrate includes an interconnecting layer that electrically connects the p-type and n-type thermoelectric conversion portions through the diffusion preventing films, and a jointing material that joins the diffusion preventing films and the interconnecting layer. Top surfaces of the diffusion preventing films are projected from upper and lower top surfaces of each insulator in a direction connecting the upper and lower top surfaces of the p-type and n-type thermoelectric conversion portions, and gap is provided on each insulator in the direction.

13 Claims, 7 Drawing Sheets

(56) References Cited

U.S. PATENT DOCUMENTS

| | | | |
|---|---|---|---|
| 2005/0115601 A1* | 6/2005 | Olsen | H01L 35/16 136/212 |
| 2007/0028955 A1* | 2/2007 | Sogou | H01L 35/10 136/200 |
| 2007/0221264 A1* | 9/2007 | Shutoh | H01L 35/32 136/224 |
| 2011/0011533 A1* | 1/2011 | Golden | C08G 59/1466 156/330 |
| 2012/0164416 A1 | 6/2012 | He et al. | |
| 2012/0263207 A1 | 10/2012 | Higashida et al. | |
| 2013/0014796 A1* | 1/2013 | Tajima | H01L 35/32 136/203 |
| 2013/0199593 A1 | 8/2013 | Higashida et al. | |
| 2013/0220394 A1 | 8/2013 | Higashida et al. | |
| 2013/0263906 A1 | 10/2013 | Maeshima et al. | |
| 2013/0284228 A1 | 10/2013 | Toyoda et al. | |

FOREIGN PATENT DOCUMENTS

| | | |
|---|---|---|
| JP | 2006-135259 | 5/2006 |
| JP | 2012-231025 | 11/2012 |
| JP | 2012-231121 | 11/2012 |
| WO | 2009/001598 | 12/2008 |
| WO | 2011/118341 | 9/2011 |
| WO | 2012/066788 | 5/2012 |
| WO | 2012/114650 | 8/2012 |
| WO | 2012/137446 | 10/2012 |

OTHER PUBLICATIONS

WIPO's English translation of the Written Opinion of the International Searching Authority issued Mar. 26, 2015 in International (PCT) Application No. PCT/JP2014/001513.

Office Action and Search Report issued Jun. 9, 2015 in Chinese Application No. 201480001975.4, with partial English translation.

International Search Report issued Jun. 17, 2014 in International (PCT) Application No. PCT/JP2014/001513.

Written Opinion of the International Searching Authority issued Jun. 17, 2014 in International (PCT) Application No. PCT/JP2014/001513.

Extended European Search Report issued Sep. 21, 2015 in European Application No. 14810734.5.

\* cited by examiner

SHORT SIDE DIRECTION

FIG. 9

SHORT SIDE DIRECTION

THERMOELECTRIC CONVERSION MODULE

BACKGROUND

1. Technical Field

The present disclosure relates to a thermoelectric conversion module.

2. Related Art

As a configuration of a thermoelectric conversion element included by a thermoelectric conversion module, for example, there is a p-type or n-type thermoelectric conversion element in which a p-type or n-type thermoelectric conversion portion is charged into a hollow cylindrical insulator as shown in WO 2012/066788. In the above-described p-type and n-type thermoelectric conversion elements, for example, the above-described p-type and n-type thermoelectric conversion portions are electrically connected to each other in series.

When a temperature difference between both surfaces of the above-described thermoelectric conversion module is provided, a heat flow occurs from the one surface on a high temperature side to the other surface on a low temperature side. When the relevant heat flow flows through each of the p-type and n-type thermoelectric conversion elements, electric power is generated by a phenomenon of generating a voltage proportional to the temperature difference between both ends of each of the p-type and n-type thermoelectric conversion elements (Seebeck effect). Moreover, a circumference of each of the above-described p-type and n-type thermoelectric conversion portions is covered with an insulator. This can prevent a short circuit between the adjacent p-type and n-type thermoelectric conversion portions, and can minimize a pitch of the p-type and n-type thermoelectric conversion elements, so that they can be densely arranged.

SUMMARY

However, in the configuration of the above-described thermoelectric conversion module, when the temperature difference is provided, the heat flow generated by the temperature difference is also transmitted to each of the above-described insulators arranged so as to cover the side surfaces of the p-type and n-type thermoelectric conversion portions. This poses a problem that a quantity of heat flowing the p-type and n-type thermoelectric conversion portions is reduced, and that thermoelectric conversion efficiency of the thermoelectric conversion module is lowered.

For example, if a ratio between a sectional area of each of the p-type and n-type thermoelectric conversion portions, and a sectional area of the insulator in a short side direction of the thermoelectric conversion element is 1:1, thermal conductivity of each of the p-type and n-type thermoelectric conversion portions is 1.4 W/mK, and thermal conductivity of the insulator is 0.6 W/mK, a quantity of heat flowing in each of the p-type and n-type thermoelectric conversion portions lowers by about 40%.

This disclosure is to solve the above-described problem, and an object of the invention is to provide a thermoelectric conversion module that can suppress a quantity of heat flowing an insulator, and increase a quantity of heat flowing in each p-type and n-type thermoelectric conversion portions to enhance thermoelectric conversion efficiency.

In one general aspect, the techniques disclosed here feature: a thermoelectric conversion module comprising a p-type thermoelectric conversion element and an n-type thermoelectric conversion element arranged between two stacked substrates, wherein the p-type thermoelectric conversion element includes:
a columnar p-type thermoelectric conversion portion;
an insulator provided in a side surface of the p-type thermoelectric conversion portion; and
a diffusion preventing film provided on each top surface, the top surface being different from the side surface of the p-type thermoelectric conversion portion, the n-type thermoelectric conversion element includes:
a columnar n-type thermoelectric conversion portion;
an insulator provided in a side surface of the n-type thermoelectric conversion portion; and
a diffusion preventing film provided on each top surface, the top surface being different from the side surface of the n-type thermoelectric conversion portion, each of the stacked substrates includes:
a interconnecting layer that electrically connects the p-type thermoelectric conversion portion and the n-type thermoelectric conversion portion through the diffusion preventing films; and
a jointing material that joins the diffusion preventing films and the interconnecting layer, top surfaces of the diffusion preventing films are projected from upper and lower top surfaces of each of the insulators in a direction connecting the upper and lower top surfaces of each of the p-type and n-type thermoelectric conversion portions, and a gap is provided on each of the insulators in the direction.

According to the thermoelectric conversion module according to the present disclosure, a quantity of heat flowing in the insulator can be suppressed, and a flow quantity flowing in each of the p-type and n-type thermoelectric conversion portions can be increased, which can enhance thermoelectric conversion efficiency.

DETAILED DESCRIPTION

Hereinafter, embodiments of this disclosure will be described with reference to the drawings. In this description, detailed descriptions of substantially overlapped portions will be omitted.

Embodiment 1

1. Configuration 1-1. Whole Configuration of Thermoelectric Conversion Module

Figure 1:
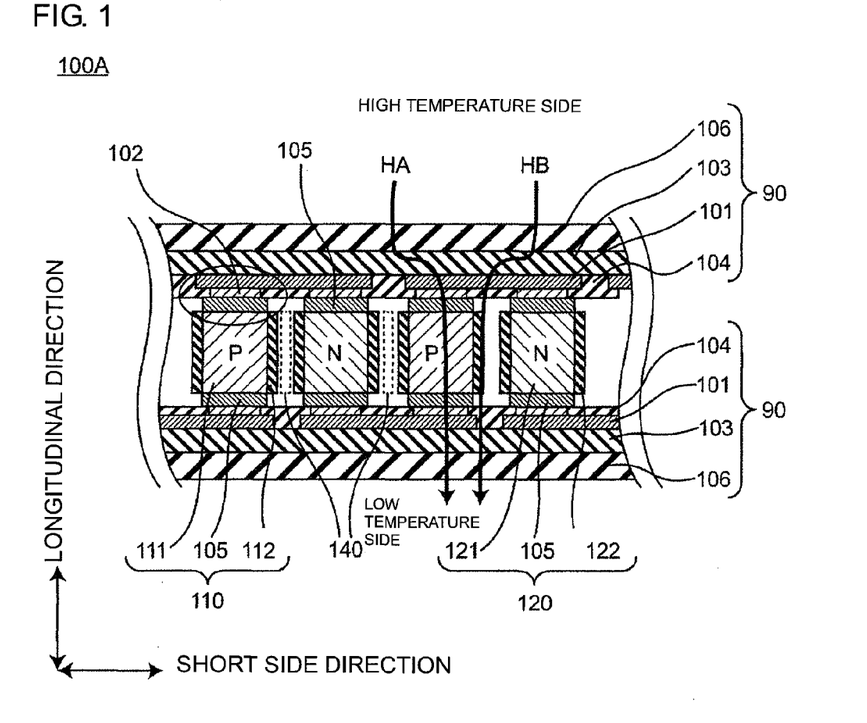
FIG. 1 is a longitudinal sectional view showing a cross section structure of a thermoelectric conversion module according to a first embodiment of the present disclosure.

First, referring to FIG. 1, a whole configuration of a thermoelectric conversion module according to a first embodiment will be described. FIG. 1 is a longitudinal sectional view showing a cross section structure of a thermoelectric conversion module 100A according to the first embodiment. As shown in FIG. 1, the thermoelectric conversion module 100A includes two upper and lower stacked substrates 90 arranged so as to be opposed to each other, and a plurality of p-type and n-type thermoelectric conversion elements 110, 120 arranged with both end portions thereof sandwiched between the two stacked substrates 90.

1-1-1. Configuration of Stacked Substrate 90

As shown in FIG. 1, each of the upper and lower stacked substrates 90 includes a heat transfer body 106, an insulating plate 103, a conductor 101, an interlayer insulating film 104, and a jointing material 102.

The heat transfer body 106 is provided on an outermost side of each of the stacked substrates 90 in a direction connecting respective upper and lower top surfaces of each of the p-type and n-type thermoelectric conversion elements 110, 120 (hereinafter, referred to as a "longitudinal direction"). For the heat transfer body 106, in the present first embodiment, for example, a ceramic substrate or the like is used. As the heat transfer body 106, in view of thermal diffusivity in a surface direction, for example, a metal body containing any of Cu, Al, and Fe, graphite or the like may be used.

The insulating plate 103 is provided on the heat transfer body 106 in each of the stacked substrates 90. For the insulating plate 103, a film made of polyimide and having a thickness of 10 μm or less, or the like can be used. Moreover, the case where the above-described film made of polyimide is used as the insulating plate 103 is preferable in view of heat receiving from a curved surface because flexibility of the thermoelectric conversion module 100A is enhanced. Furthermore, when a film made of polyimide is used as the insulating plate 103, the heat transfer body 106 having high thermal conductivity may be included outside the insulating plate 103 as in the present first embodiment. The use of the heat transfer body 106 having high thermal conductivity increases thermal diffusivity and rigidity in the surface direction more, which is more preferable.

The conductors (interconnecting layers) 101 are respectively provided on the upper surface side and the lower surface side of the P-type and n-type thermoelectric conversion elements 110, 120 in the respective stacked substrates 90 so as to electrically connect the p-type and n-type thermoelectric conversion elements 110, 120 adjacent in a direction perpendicular to the longitudinal direction (hereinafter, referred to as a "short side direction") (connect to each other in series in the present embodiment). As a material of the conductors 101, for example, an alloy containing two or more of Bi, Cu, Sb and In, or the like can be used.

The interlayer insulating film 104 is provided in each of the stacked substrates 90 through gap 130 (not shown in FIG. 1) described later between the conductor 101 and tubes 112, 122 in the longitudinal direction. Moreover, as described later, the interlayer insulating film 104 is provided for the purpose of increasing thermal resistance of heat paths to the tubes 112, 122. The interlayer insulating film 104 is formed of, for example, an imide compound, acrylic resin or the like. In order to further increase thermal resistance, it is effective that predetermined irregularities are provided on a surface of the interlayer insulating film 104 to reduce a contact area between the tubes 112, 122 and the interlayer insulating film 104. More specifically, surface roughness provided in the surface of the interlayer insulating film 104 is preferably larger than surface roughness of the tubes 112, 122. The surface roughness can prevent heat from flowing from the interlayer insulating film 104 to the tubes 112, 122. The surface roughness of the interlayer insulating film 104 is preferably 0.1 mm or more, for example. Moreover, the inventors have found it effective for suppressing the inflow of heat to set a difference of the surface roughness between the tubes 112, 122 and the interlayer insulating film 104 to 80 μm or more. Here, the surface roughness refers to a center line average roughness Ra per 1 μm$^2$.

The jointing material 102 is provided inside respective opening portions 104a (not shown in FIG. 1) formed in the interlayer insulating film 104 located, corresponding to diffusion preventing films 105 to join the p-type and n-type thermoelectric conversion elements 110, 120, and each of the stacked substrates 90. The jointing material 102 is solder to guide an electric current to the conductor 101 from p-type and n-type thermoelectric conversion portions 111, 121. The present embodiment is not limited to this, but for the jointing material 102, for example, a single-metal, an alloy containing any of Sn, Pb, Ag, Bi, In, Sb, and Au, or the like can be used.

1-1-2. Configuration of p-Type and n-Type Thermoelectric Conversion Elements 110, 120

Next, the p-type and n-type thermoelectric conversion elements 110, 120 include the columnar p-type and n-type thermoelectric conversion portions 111, 121, the tubes 112, 122, and the diffusion preventing films 105, respectively, as shown in FIG. 1.

The p-type and n-type thermoelectric conversion portions 111, 121 are columnar members each formed of a predetermined thermoelectric conversion material that generates an electromotive force when a temperature difference is caused between both ends. As the p-type and n-type thermoelectric conversion portions 111, 121, in the present first embodiment, a Bi—Te (bismuth-tellurium) based material having a high electromotive force in a temperature range of a normal temperature to 500 K is used. For the p-type and n-type thermoelectric conversion portions 111, 121, the material can be selected in accordance with the temperature difference existing during use. For example, if the temperature difference is in a range of the normal temperature to 800 K, a Pb—Te (lead-tellurium) based material can be used, and if the temperature difference is in a range of the normal temperature to 1,000 K, a Si—Ge (silicon-germanium) based material can be used.

The p-type and n-type thermoelectric conversion portions 111, 121 can be formed by adding proper p-type and n-type dopants to the above-described thermoelectric conversion material. As the p-type dopant for obtaining the p-type thermoelectric conversion portion 111, for example, Sb is cited. As the n-type dopant for obtaining the n-type thermoelectric conversion portion 121, for example, Se is cited. The addition of these p-type and n-type dopants allows the thermoelectric conversion material to form mixed crystal. Accordingly, these p-type and n-type dopants are added in an amount expressed, for example, by a composition formula such as "$Bi_{0.5}Sb_{1.5}Te_3$", "$Bi_2Te_{2.7}Se_{0.3}$" and the like. Moreover, as a shape of the p-type and n-type thermoelectric conversion portions 111, 121, a polygonal column and a column are preferable in view of productivity of the elements and alignment of a crystal orientation of the thermoelectric conversion material in an axial direction of the tubes. Further, the column, which can suppress stress concentration on corners, is more preferable in view of prevention of crack of the thermoelectric conversion portions 111, 121 made of the thermoelectric conversion material, which is brittle.

A length L in the longitudinal direction of the p-type and n-type thermoelectric conversions 111, 121 is preferably in a range of 0.3 mm to 2.0 mm, for example, in view of generation of the proper temperature difference between both the ends of the p-type and n-type thermoelectric conversion portions 111, 121.

If a sectional area in the short side direction of the p-type and n-type thermoelectric conversion portions 111, 121 is too small, the thermoelectric conversion portions are destroyed, while if it is too large, a number of thermoelectric conversion elements per unit area in the thermoelectric conversion module 100A is reduced, thereby leading to deterioration in performance. Thus, the sectional area in the short side direction of the p-type and n-type thermoelectric conversion portions 111, 121 is preferably in a range of 0.1 mm$^2$ to 4 mm$^2$, for example.

The tubes (insulators) 112, 122 are provided so as to surround side surfaces of the p-type and n-type thermoelectric conversion portions 111, 121. The tubes 112, 122 are each a member formed of an insulating material having a heat-resisting property and an insulation property, and having a cavity open to both the ends. A shape of the tubes 112, 122 can be, for example, cylindrical, polygonal tubular, polygonal tubular with R at each corner, and the like. As a material of the tube 112, 122, for example, a metal oxide of silica, aluminum and the like, heat-resistant glass, quartz, and the like can be cited. Moreover, as the material of the tubes 112, 122, quartz is preferable in view of the heat-resisting property, and further, in light of manufacturing cost, the heat-resistant glass is preferable. Moreover, the surface roughness of cut surfaces of the tubes 112, 122 is, for example, in a range of 10 μm to 20 μm because the tubes are cut with a wire saw, a dicer or the like when the p-type and n-type thermoelectric conversion elements 110 120 are formed, as described later.

A sectional area in the short side direction of the tubes 112, 122 is smaller than the sectional area in the short side direction of the p-type and n-type thermoelectric conversion portions 111, 121, a sectional area ratio of the p-type and n-type thermoelectric conversion portions 111, 121 to the whole thermoelectric conversion module 100A can be made larger. This enhances thermoelectric conversion performance of the thermoelectric conversion module 100A. On the other hand, if the sectional area in the short side direction of the tubes 112, 122 is too small, as compared with that of the p-type and n-type thermoelectric conversion portions 111, 121, deterioration in mechanical strength of the p-type and n-type thermoelectric conversion elements 110, 120 is caused. Thus, it is preferable that the sectional area in the short side direction of the tubes 112, 122 is, for example, in a range of 0.2 to 1.7 times the sectional area in the short side direction of the p-type and n-type thermoelectric conversion portions 111, 121.

The diffusion preventing films 105 are provided on respective upper and lower top surfaces of the p-type and n-type thermoelectric conversion portions 111, 121. Moreover, the diffusion preventing films 105 are provided to prevent elements in the jointing material 102 from diffusing to the p-type and n-type thermoelectric conversion portions 111, 121. For the diffusion preventing films 105, in the present first embodiment, Ni is used. The present embodiment is not limited to this, but as the diffusion preventing films 105, for example, a single-metal, an alloy containing any of Ni, Mo, Ti, and W, or the like can be used. Moreover, for the diffusion preventing films 105, Ni or Mo may be used.

Moreover, the thermoelectric conversion module 100A according to the present first embodiment further has gap (second gap) 140 that each separate the p-type and n-type thermoelectric conversion elements 110, 120 adjacent in the short side direction.

Figure 2:
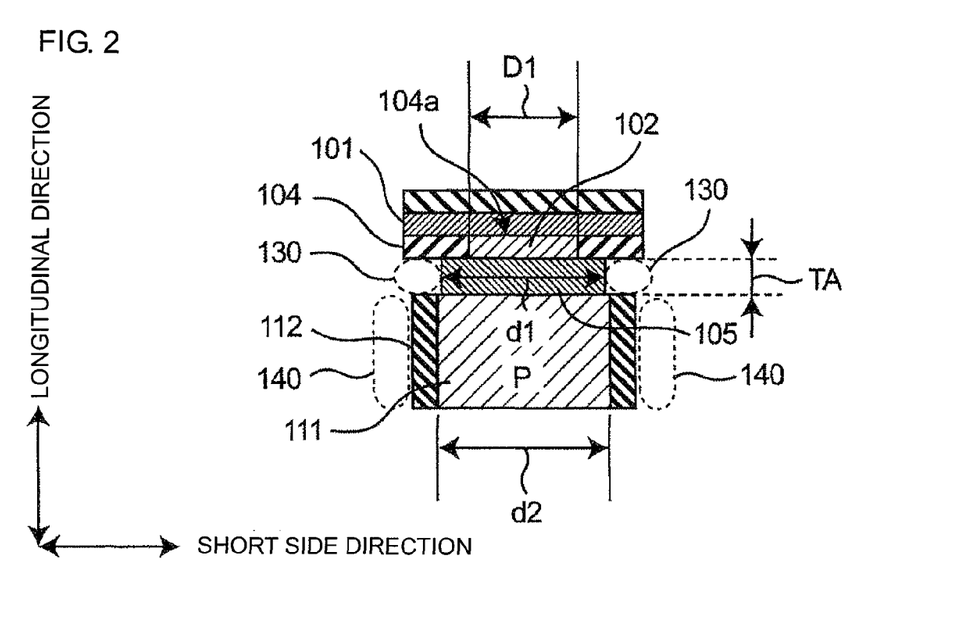
FIG. 2 is a longitudinal sectional view showing a vicinity of an upper top surface of a thermoelectric conversion element in FIG. 1 in an enlarged manner.

1-2. Configuration of Vicinity of Top Surfaces of p-type and n-type Thermoelectric Conversion Elements Next, a configuration of a vicinity of each of the top surfaces of the p-type and n-type thermoelectric conversion elements 110, 120 will be described. FIG. 2 is a longitudinal sectional view showing the vicinity of the upper top surface of the p-type thermoelectric conversion element 110 in FIG. 1 in an enlarged manner, in which a portion indicated by being surrounding in FIG. 1 is enlarged. Here, referring to FIG. 2, the configuration of the vicinity of the upper top surface of the p-type thermoelectric conversion element 110 will be described as one example.

As shown in FIG. 2, the p-type thermoelectric conversion element 110 has the gap 130 that separates the tube 112 and the interlayer insulating film 104 at a predetermined interval (substantially, a film thickness TA of the diffusion preventing film 105) in the longitudinal direction. As shown in FIG. 2, the diffusion preventing film 105 substantially covers only the top surface of the p-type thermoelectric conversion portion 111, and does not cover a top surface of the tube 112. This configuration allows the gap 130 by the film thickness TA of the diffusion preventing film 105 to be formed between the tube 112 and the interlayer insulating film 104. In other words, top surfaces of the diffusion preventing films 105 are projected from the upper and lower top surfaces of the tube 112 in the longitudinal direction. As a result, the p-type thermoelectric conversion element 110 has the gap 130 on the tube 112 in the longitudinal direction.

Moreover, in each of these gap 130, in the present first embodiment, air is filled. However, the present embodiment is not limited to the air, but the gap 130 is preferably filled (charged) with gas such as decompressed (negative-pressure) air or the like. This is because thermal conductivity of the decompressed gas is low. Moreover, predetermined gas such as argon gas and the like having lower thermal conductivity than general dry air may be filled. It is more preferable that the predetermined gas is decompressed argon gas. Furthermore, the gap 130 is more desirably a vacuum, which brings about a higher heat insulation effect. As described later, this gap 130 is provided, so that the gap 130 serves as a heat insulator, which can restrain heat received from the heat transfer body 106 on a high temperature side (heat receiving side) from directly flowing from the interlayer insulating film 104 to the tube 112. Thus, the received heat can be efficiently guided to the p-type thermoelectric conversion portion 111.

Here, it is preferable for providing the gap 130 to satisfy a predetermined relationship that an outer diameter dimension d1 of the diffusion preventing film 105 is smaller than an outer diameter dimension d2 of the p-type thermoelectric conversion portion 111, and that an inner diameter dimension D1 of the opening portion 104a of the interlayer insulating film 104 is smaller than the outer diameter dimension d1 of the diffusion preventing film 105 (d1<d2, D1<d1). In other words, it is preferable to satisfy a relationship that a sectional area of the diffusion preventing film 105 in the short side direction is larger than a sectional area of the opening portion 104a, and that a sectional area of each of the top surfaces of the p-type and n-type thermoelectric conversion portions 111, 121 is larger than the sectional area of the diffusion preventing film 105. By satisfying the above-described predetermined relationship, the gap 130 that separates the tube 112 and the interlayer insulating film 104 substantially at the interval of the film thickness TA of the diffusion preventing film 105 can be provided between the tube 112 and the interlayer insulating film 104.

Furthermore, in order to minimize jointing resistance between the conductor 101 and the p-type and n-type thermoelectric conversion portions 111, 121, it is more preferable that, for example, the inner diameter dimension D1 of the opening portion 104a is about 90% of the outer diameter dimension d1 of the diffusion preventing film 105.

Moreover, in light of variation in position in a manufacturing method described later, with respect to a position aberration amount d1_xy in an xy direction of the outer diameter dimension d1 of the diffusion preventing film 105, it is preferable that the inner diameter dimension D1 of the opening portion 104a is smaller than a difference by the position aberration amount d1_xy from the outer diameter dimension d1 of the diffusion preventing film 105 (D1<d1−d1_xy). Furthermore, with respect to a position aberration amount d2_xy in the xy direction of the outer diameter dimension d2 of the p-type thermoelectric conversion portion 111, it is more preferable that the outer diameter dimension d1 of the diffusion preventing film 105 is smaller than a difference by the position aberration amount d2_xy from the outer diameter dimension d2 of the p-type thermoelectric conversion portion 111 (d1<d2−d2_xy).

It is preferable that the film thickness TA of the diffusion preventing film 105 is 5 μm or more in that the jointing material 102 is restrained from wetly spreading from the opening portion 104a to the tube 112. On the other hand, if the film thickness TA is too large, electric resistance becomes higher. Thus, the film thickness TA of the diffusion preventing film 105 is preferably 30 μm or less.

In the above description, with reference to FIG. 2, the configuration of the upper top surface of the p-type thermoelectric conversion element 110 has been described as one example. However, in a configuration of the lower top surface of the p-type thermoelectric conversion element 110 as well, similarly, the gap 130 is provided that separates the tube 112 and the interlayer insulating film 104 at the predetermined interval (substantially, the film thickness TA of the diffusion preventing film 105) in the longitudinal direction. Furthermore, in each configuration of the upper and lower top surfaces of the n-type thermoelectric conversion element 120 as well, similarly, the gap 130 is provided that separates the tube 122 and the interlayer insulating film 104 at the predetermined interval (substantially, film thickness TA of the diffusion preventing film 105) in the longitudinal direction.

2. Power Generation Operation

Next, referring to FIG. 1, power generation operation of the thermoelectric conversion module 100A according to the first embodiment will be described.

Here, in the configuration of the thermoelectric conversion module 100A shown in FIG. 1, the heat transfer body 106 of the upper stacked substrate 90 has a high temperature, and the heat transfer body 106 of the lower stacked substrate 90 has a low temperature. Thereby, a temperature difference between the high temperature and the low temperature generates a heat flow of heat flowing from the upper stacked substrate 90 on the high temperature side (heat receiving side) to the lower stacked substrate 90 on the low temperature side (heat radiating side).

The generated heat flow sequentially flows from the heat transfer body 106 on the high temperature side to the insulating plate 103, the conductor 101, the jointing material 102, the diffusion preventing film 105 and the p-type thermoelectric conversion portion 111, as a flow path indicated by arrow HA in FIG. 1. This allows the p-type thermoelectric conversion portion 111 to generate a voltage proportional to the temperature difference between both ends in an end portion on the high temperature side and an end portion on the low temperature side. Here, the flow path indicated by arrow HA refers to a flow path in which the heat flow sequentially flows from the heat transfer body 106 on the high temperature side to the insulating plate 103, the conductor 101, the jointing material 102, the diffusion preventing film 105, and the p-type thermoelectric conversion portion 111 (or the n-type thermoelectric conversion portion 121), and further flows up to the heat transfer body 106 of the lower stacked substrate 90 on the low temperature side.

In the n-type thermoelectric conversion element 120 as well, similarly, the generated heat flow flows in the flow path indicated by arrow HA, by which the n-type thermoelectric conversion portion 121 generates a voltage proportional to the temperature difference between both ends in an end portion on the high temperature side and an end portion of the low temperature side. Here, polarity of the voltage generated in the n-type thermoelectric conversion element 120 is different from polarity generated in the p-type thermoelectric conversion element 110. Consequently, in order to prevent the generated voltages from being offset, the conductor 101 electrically connects the p-type and n-type thermoelectric conversion elements 110, 120 adjacent to each other in the short side direction in series. The above-described electric connection enables a larger electromotive force to be generated in the whole thermoelectric conversion module 100A.

Here, as the flow paths of the heat flow generated by the temperature difference given to the thermoelectric conversion module 100A, not only the above-described flow path indicated by arrow HA, which contributes to the power generation, but a flow path indicated by arrow HB in FIG. 1 exists, in which a heat flow does not flow through each of the p-type and n-type thermoelectric conversion portions 111, 121. The flow path indicated by arrow HB does not contribute to the power generation. The flow path indicated by arrow HB refers to a flow path in which the heat from the heat transfer body 106 on the high temperature side sequentially flows through the insulating plate 103, the conductor 101, the interlayer insulating film 104, the gap 130, and the tube 112 (or 122), and then flows up to the heat transfer body 106 of the lower stacked substrate 90 on the low temperature side.

However, as described above, the thermoelectric conversion module 100A according to the first embodiment has the gap 130 that separate the tubes 112, 122 and the interlayer insulating film 104 in the longitudinal direction. Since in these gap 130, in the first embodiment, air is filled, a value of thermal resistance of each of the gap 130 is larger by one or more digits than that of thermal resistance of a solid substance such as, for example, an insulating material. This allows these gap 130 to serve as heat insulators, which can suppress a quantity of heat flowing in the flow path of arrow HB not contributing to power generation. Since the quantity of heat flowing in this flow path of arrow HB is suppressed, the flow path of arrow HA contributing to the power generation becomes dominant, so that the quantity of heat flowing in the flow path of arrow HA can be increased. This can enhance thermoelectric conversion efficiency of the thermoelectric conversion module 100A.

If the outer diameter dimension d1 of the diffusion preventing film 105 is larger than the outer diameter dimension d2 of the p-type and n-type thermoelectric conversion portions 111, 121, a volume of the gap 130 is reduced. As a result, a part of the heat flow indicated by arrow HA flows to the tubes 112, 122 through the diffusion preventing films 105, which disadvantageously decreases the heat flow flowing to the p-type and n-type thermoelectric conversion portions 111, 121. Moreover, if the outer diameter dimension d1 of the diffusion preventing film 105 is smaller than the inner diameter dimension D1 of the opening portion 104a, there are fears that the jointing material 102 inside the opening portion 104a has a portion in contact with each of the p-type and n-type thermoelectric conversion portions 111, 121. In this case, there is a possibility that the relevant contacting portion wetly spreads to the whole top surface of each of the p-type and n-type thermoelectric conversion portions 111, 121, thereby coming into contact with each of the tubes 112, 122. Moreover, the jointing material 102 is the solder to guide the electric current from the p-type and n-type thermoelectric conversion portions 111, 121 to the conductor 101, and this jointing material 102 has high thermal conductivity. Thus, if the outer diameter dimension d1 of the diffusion preventing film 105 is smaller than the inner diameter dimension D1 of the opening portion 104a, inflow of the heat to each of the tubes 112, 122 through the jointing material 102 is increased. Therefore, it is preferable to satisfy the predetermined relationship that the outer diameter dimension d1 of the diffusion preventing film 105 is smaller than the outer diameter dimension d2 of the p-type thermoelectric conversion portion 111, and that the inner diameter dimension D1 of the opening portion 104a of the interlayer insulating film 104 is smaller than the outer diameter dimension d1 of the diffusion preventing film 105 (d1<d2, D1<d1).

3. Manufacturing Method Next, referring to FIGS. 3 to 9, a manufacturing method of the thermoelectric conversion module 100A according to the first embodiment will be described.

3-1. Manufacturing Process of p-Type and n-Type Thermoelectric Conversion Elements 110, 120

Figure 3:
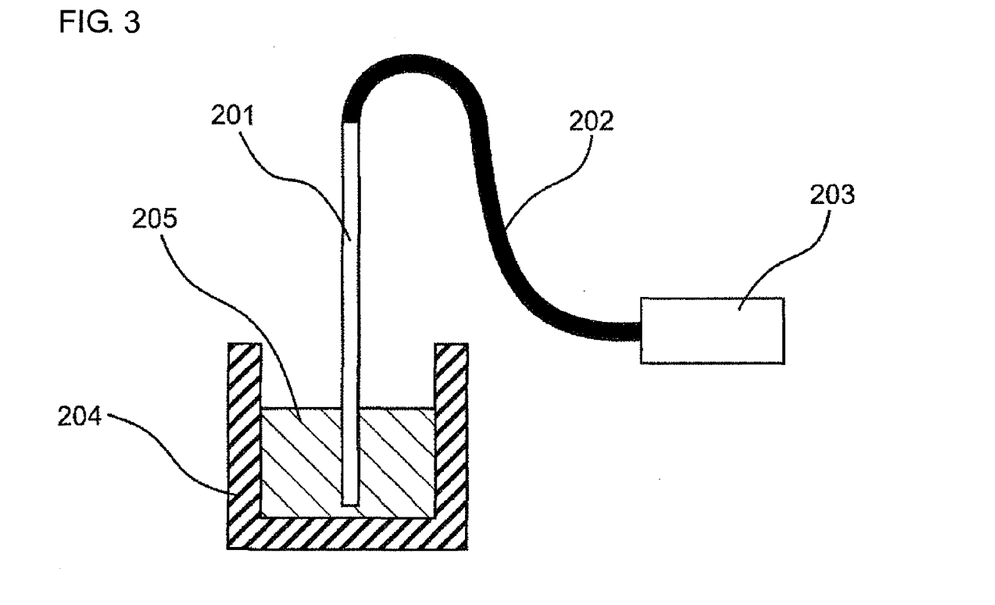
FIG. 3 is a view showing one manufacturing process of the thermoelectric conversion module according to the first embodiment.
Figure 4:
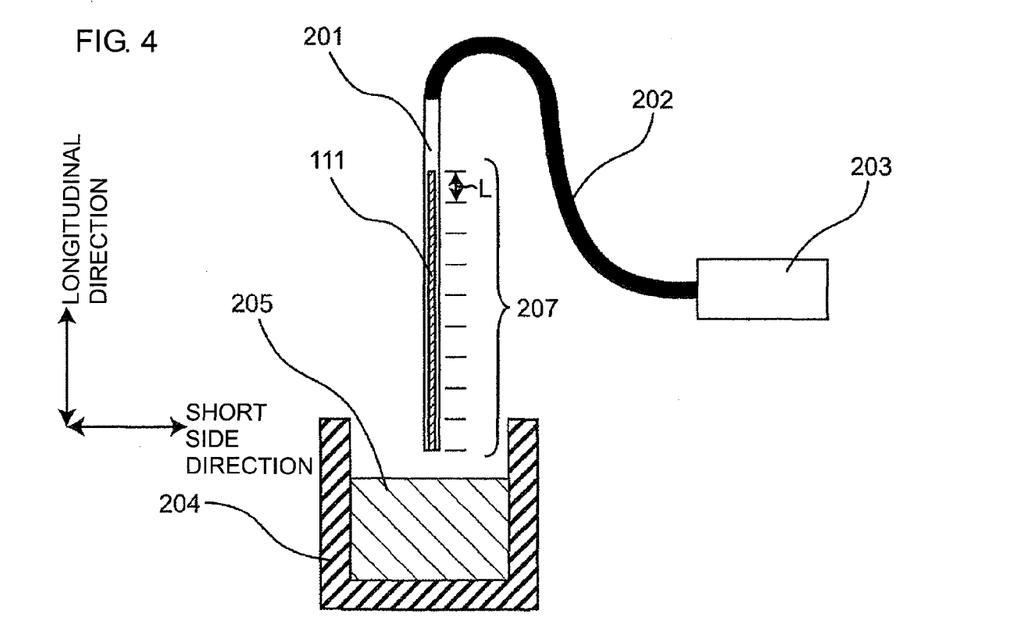
FIG. 4 is a view showing one manufacturing process of the thermoelectric conversion module according to the first embodiment.

Referring to FIGS. 3 and 4, a manufacturing process of the p-type and n-type thermoelectric conversion elements 110, 120 will be described. Here, the manufacturing process of the p-type thermoelectric conversion element 110 including the p-type thermoelectric conversion portion 111, the tube 112, and the diffusion preventing films 105 will be described as one example.

First, as shown in FIG. 3, a pipe 201 having a heat-resisting property and an insulation property is prepared. In the present first embodiment, for the pipe 201, for example, glass, particularly, heat-resistant glass (one kind of borosilicate glass with $SiO_2$ and $B_2O_3$ mixed, and a material having a coefficient of thermal expansion of about $3\times10^{-6}$/K) may be used. Moreover, for the pipe 201, for example, a pipe having a whole length of 150 mm, and an inner diameter of 0.8 mm and an outer diameter of 2 mm can be used. A cylinder 203 is attached to one end of the pipe 201 through a silicon tube 202, and another end is immersed in a molten thermoelectric conversion material 205 inside a melting pot 204. Here, the molten thermoelectric conversion material 205 is a p-type thermoelectric conversion material (or n-type thermoelectric conversion material) molten by heating.

Subsequently, as shown in FIG. 4, by operating the cylinder 203, the molten thermoelectric conversion material 205 is sucked into the pipe 201. The sucked molten thermoelectric conversion material 205 is cooled and coagulated inside the pipe 201. Subsequently, along a short side direction substantially perpendicular to a longitudinal direction of the pipe 201, for example, a wire saw or a dicer 207 is controlled so as to set a desired length L in the longitudinal direction, and simultaneously cut the p-type thermoelectric conversion portion 111 and the pipe 201. By the above-described cutting process, the p-type thermoelectric conversion portion 111 is cut off from the pipe 201, by which the p-type thermoelectric conversion portion 111 and the tube 112 are simultaneously formed.

Subsequently, although the illustration is omitted, the diffusion preventing film 105 made of Ni or the like is selectively formed on each of the upper and lower top surfaces of the formed p-type thermoelectric conversion portion 111, for example, using a barrel plating method. In this process, a formation condition is controlled so as to satisfy the predetermined relationship (d1<d2, D1<d1) that the outer diameter dimension d1 of the formed diffusion preventing film 105 is smaller than the outer diameter dimension d2 of the p-type thermoelectric conversion portion 111, and that the inner diameter dimension D1 of the opening portion 104a of the interlayer insulating film 104 described later is smaller than the outer diameter dimension d1 of the diffusion preventing film 105. Furthermore, in this process, it is preferable to control the formation condition so that the film thickness TA of the formed diffusion preventing film 105 is 5 µm or more, and 30 µm or less.

By the above-described manufacturing process, the plurality of p-type thermoelectric conversion elements 110 are formed. A manufacturing process of the n-type thermoelectric conversion element 120 is substantially similar to the above-described manufacturing process of the p-type thermoelectric conversion element 110 except that the molten thermoelectric conversion material molten in the melting pot 204 is an n-type thermoelectric conversion material. Thus, a detailed description of the manufacturing process of the n-type thermoelectric conversion element 120 will be omitted.

3-2. Mounting Process of p-Type and n-Type Thermoelectric Conversion Elements 110, 120

Next, with reference to FIGS. 5 to 9, a mounting process of the p-type and n-type thermoelectric conversion elements 110, 120 on the stacked substrates 90 will be described.

Figure 5:
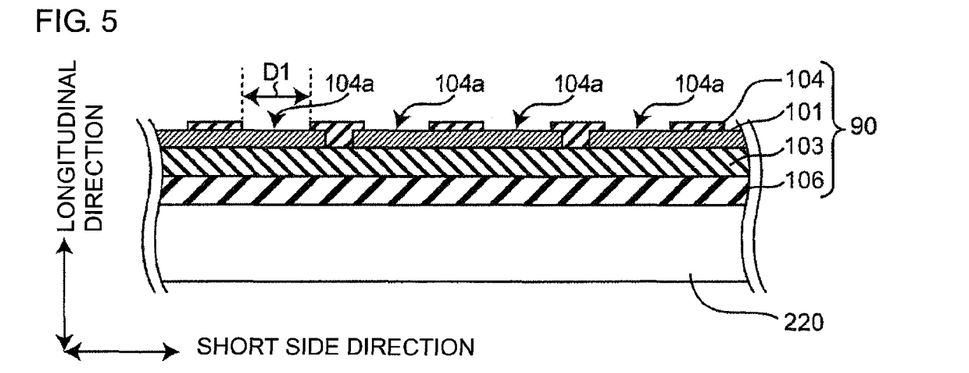
FIG. 5 is a longitudinal sectional view showing one manufacturing process (substrate preparation process) of the thermoelectric conversion module according to the first embodiment.

First, as shown in FIG. 5, the lower stacked substrate 90 is prepared on a conveyance tray 220. As shown in FIG. 5, the lower stacked substrate 90 includes the insulating plate 103, the conductor 101, and the interlayer insulating film 104, which are sequentially stacked on the heat transfer body 106. The conductor 101 is partially separated in the short side direction so as to electrically mutually connect, in series, the p-type and n-type thermoelectric conversion elements 110, 120, which will be mounted in a later process. Furthermore, in the interlayer insulating film 104, the opening portions 104a each having the inner diameter dimension D1 are formed, using an etching process or the like, for example. In forming the opening portions 104a, it is preferable to control the formation condition so that the inner diameter dimension D1 of each of the opening portions 104a is smaller than the outer diameter dimension d1 of each of the diffusion preventing films 105 (D1<d1).

Subsequently, in a solder printing process shown in FIG. 6, for example, solder in an optimized amount is printed, for example, by screen printing to form the jointing material 102 inside each of the opening portions 104a of the interlayer insulating film 104. For the upper stacked substrate 90 as well, similar processes shown in FIGS. 5 and 6 are performed to similarly form the upper stacked substrate 90.

Figure 7:
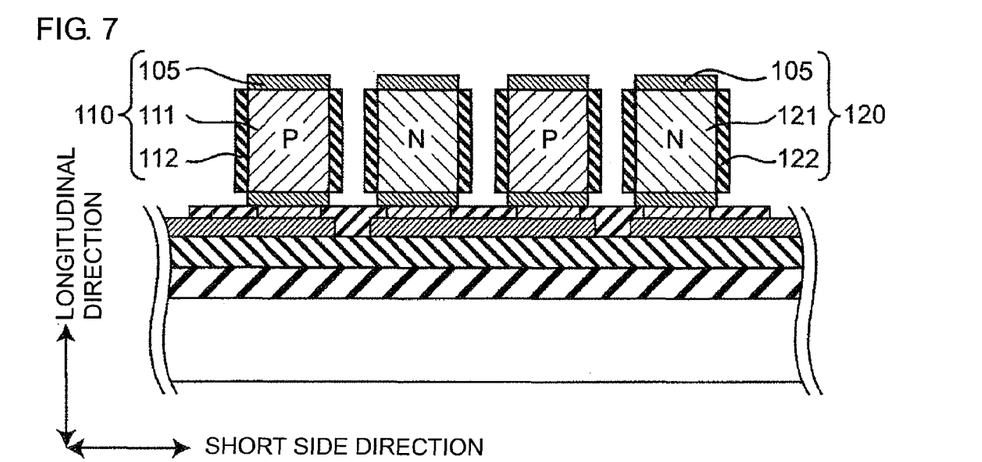
FIG. 7 is a longitudinal sectional view showing one manufacturing process (element mounting process) of the thermoelectric conversion module according to the first embodiment.

Subsequently, in an element mounting process shown in FIG. 7, the p-type and n-type thermoelectric conversion elements 110, 120 are mounted on the jointing material 102 of the lower stacked substrate 90, for example, using a chip mounter or the like. The mounted p-type and n-type thermoelectric conversion elements 110, 120 are electrically connected to each other by the conductor 101 in series. Subsequently, a predetermined reflow process is performed, and heating and cooling are performed, for example, in a reflow furnace having a predetermined temperature profile so that the jointing material 102 is molten and coagulated inside the respective opening portions 104a of the interlayer insulating film 104.

Figure 6:
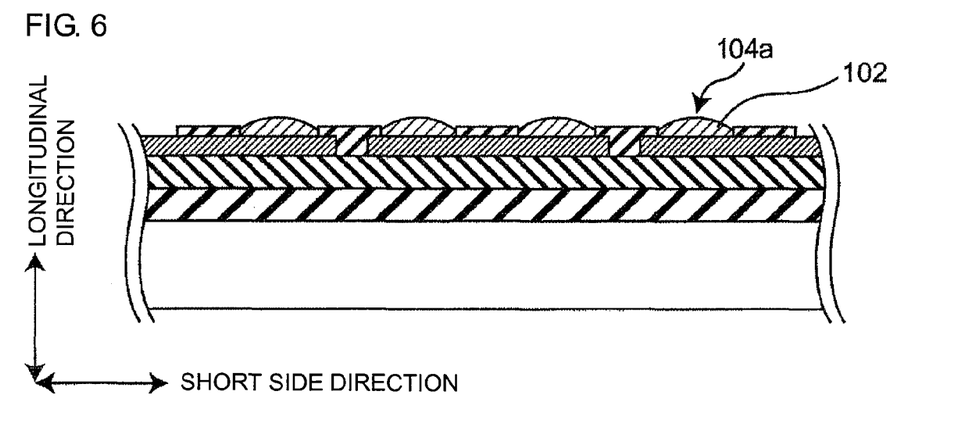
FIG. 6 is a longitudinal sectional view showing one manufacturing process (solder printing process) of the thermoelectric conversion module according to the first embodiment.
Figure 8:
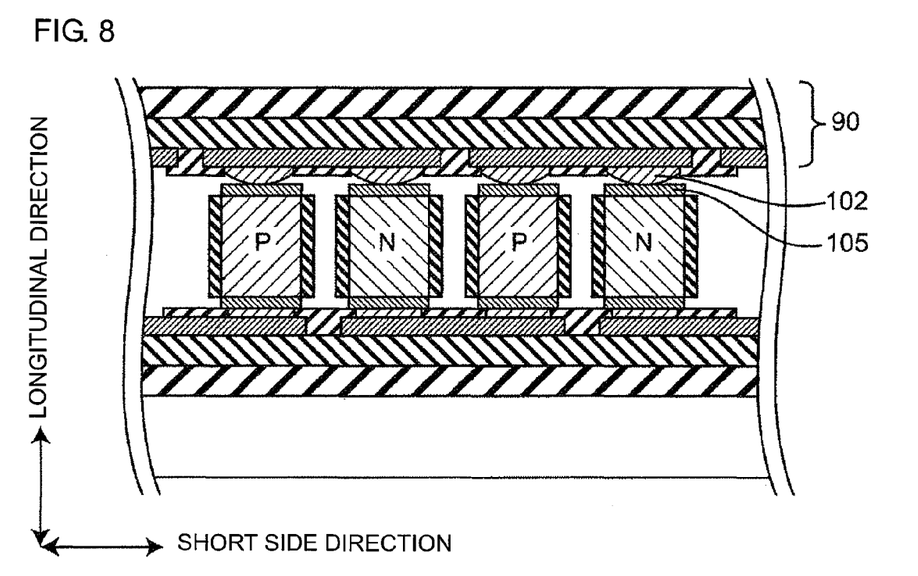
FIG. 8 is a longitudinal sectional view showing one manufacturing process (substrate mounting process) of the thermoelectric conversion module according to the first embodiment.

Subsequently, in a substrate mounting process shown in FIG. 8, processes similar to those shown in FIGS. 5 and 6 are performed to prepare the upper stacked substrate 90 formed similarly. The upper stacked substrate 90 is mounted so that the jointing material 102 of the prepared upper stacked substrate 90 is arranged on the respective upper diffusion preventing films 105 of the p-type and n-type thermoelectric conversion elements 110, 120.

Figure 9:
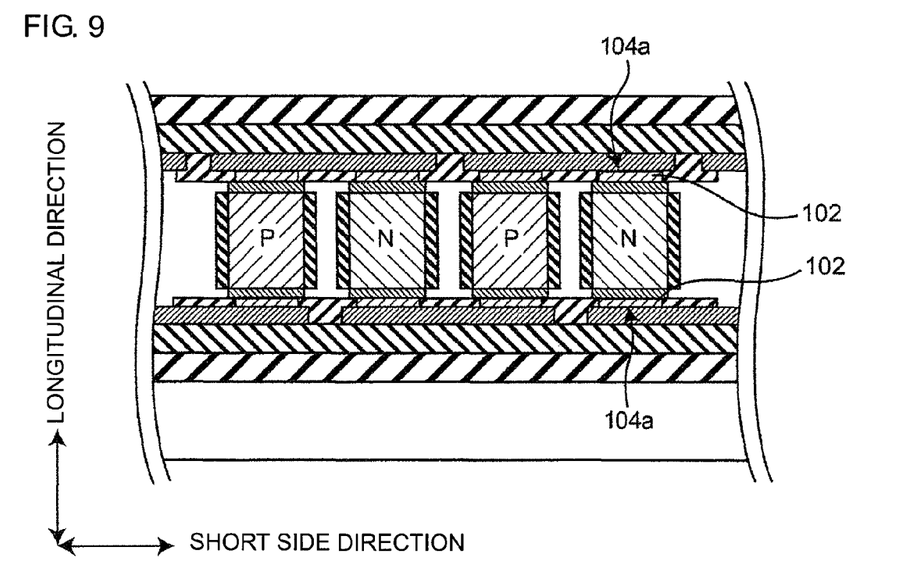
FIG. 9 is a longitudinal sectional view showing one manufacturing process (reflow process) of the thermoelectric conversion module according to the first embodiment.

Subsequently, in a reflow process shown in FIG. 9, in a state where the upper stacked substrate 90 is weighted, the heating and cooling are performed, for example, in the reflow furnace having the predetermined temperature profile so as to melt and coagulate the jointing material 102 inside the respective opening portions 104a of the interlayer insulating film 104. The jointing material 102 is molten and coagulated inside the respective opening portions 104a to manufacture the thermoelectric conversion module 100A according to the present first embodiment. As described above, in the present first embodiment, the reflow process is performed for each of the upper and lower stacked substrates 90 to form the jointing material 102 inside the respective predetermined opening portions 104a. This enables the thermoelectric conversion module 100A to be manufactured in the range of permittable position aberration.

4. Action Effects

As described above, the thermoelectric conversion module 100A according to the first embodiment has the gap 130 that separate the tubes 112, 122 and the interlayer insulating film 104 in the longitudinal direction. In the first embodiment, since these gap 130 are filled with air, the thermal resistance of the gap 130 is larger by one or more digits than that of a solid substance such as, for example, an insulating material. Thus, the gap 130 can serve as the heat insulators to suppress the quantity of heat flowing in the flow path of arrow HB not contributing to the power generation shown in FIG. 1. Since the quantity of the heat flowing in this flow path of arrow HB is suppressed, the quantity of heat flowing in the flow path of arrow HA contributing to the power generation shown in FIG. 1 can be increased. This can enhance the thermoelectric conversion efficiency of the thermoelectric conversion module 100A.

For example, when a ratio between the sectional area in the short side direction of the p-type and n-type thermoelectric conversion portions 111, 121, and the sectional area in the short side direction of the tubes 112, 122 is 1:1, thermal conductivity of the p-type and n-type thermoelectric conversion portions 111, 121 is 1.4 Mink, and thermal conductivity of the tubes 112, 122 is 0.6 W/mK, the quantity of heat flowing in the p-type and n-type thermoelectric conversion portions 111, 121 decreases by about 40%. However, in the present first embodiment, providing the above-described gap 130 can suppress most of the quantity of heat flowing in the tubes 112, 122. Thus, the heat quantity flowing in the tubes 112, 122 is suppressed, and the heat quantity flowing in the p-type and n-type thermoelectric conversion portions 111, 121 is increased more, which can enhance the thermoelectric conversion efficiency of the thermoelectric conversion module 100A.

Furthermore, the thermoelectric conversion module 100A according to the present first embodiment has a gap 140 that each separate the p-type and n-type thermoelectric conversion elements 110, 120 adjacent in the short side direction. Thus, increasing thermal resistance between the p-type and n-type thermoelectric conversion elements 110, 120 adjacent in the short side direction more increases the quantity of heat flowing in the p-type and n-type thermoelectric conversion portions 111, 121, which can enhance the thermoelectric conversion efficiency of the thermoelectric conversion module 100A.

Embodiment 2

Figure 10:
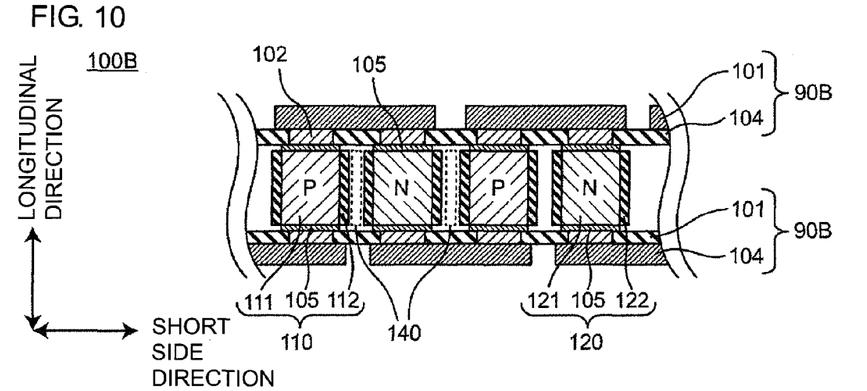
FIG. 10 is a longitudinal sectional view showing a cross section structure of a thermoelectric conversion module according to a second embodiment.

Next, referring to FIG. 10, a thermoelectric conversion module according to a second embodiment will be described. FIG. 10 is a longitudinal sectional view showing a cross section structure of a thermoelectric conversion module 100B according to the second embodiment.

As shown in FIG. 10, the thermoelectric conversion module 100B according to the second embodiment is characterized by including lower and upper stacked substrates 90B. The stacked substrates 90B are different from the stacked substrates 90 according to the above-described first embodiment in that each of the stacked substrates 90B does not include the heat transfer body 106 and the insulating plate 103.

As to a manufacturing method, in the substrate preparation process described in FIG. 5, in place of the stacked substrates 90, the lower and upper stacked substrates 90B each including a conductor 101 and an interlayer insulating film 104 only need to be prepared similarly. Other configurations, operation, and manufacturing methods are substantially similar to those in the first embodiment, and thus, detailed descriptions will be omitted.

As described above, while each of the stacked substrates 90B of the thermoelectric conversion module 100B according to the second embodiment includes the conductor 101 and the interlayer insulating film 104, it does not include the heat transfer body 106 and the insulating plate 103. According to this configuration of the stacked substrates 90B, since the heat transfer body 106 and the insulating plate 103 are not included, a heat flow from a heat source flows to p-type and n-type thermoelectric conversion portions 111, 121 only through the conductor 101 and the interlayer insulating film 104 without passing through the heat transfer body 106 and the insulating plate 103. Thus, the heat flow efficiently flows without heat loss by passing through the heat transfer body 106 and the insulating plate 103, which can enhance thermoelectric conversion efficiency of the thermoelectric conversion module 100B.

Here, if a temperature difference between a high temperature side and a low temperature side is difficult to obtain, so that the temperature difference is small, it is necessary to obtain a larger temperature difference between both ends of the p-type and n-type thermoelectric conversion portions 111, 121 under a situation of a small temperature gradient. Thus, under the above-described situation, the thermoelectric conversion module 100B according to the second embodiment, in which heat loss from the heat source to respective top surfaces of the p-type and n-type thermoelectric conversion portions 111, 121 is small, is more effective in view of thermoelectric conversion efficiency.

Embodiment 3

Figure 11:
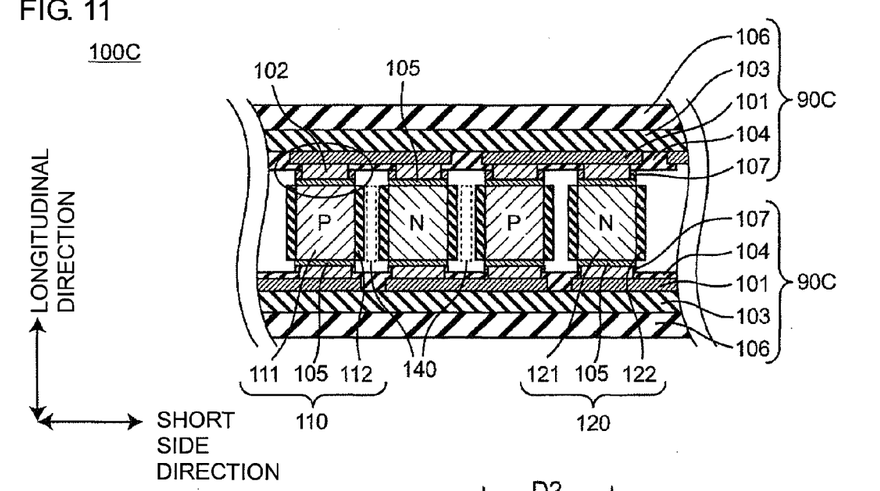
FIG. 11 is a longitudinal sectional view showing a cross section structure of a thermoelectric conversion module according to a third embodiment.
Figure 12:
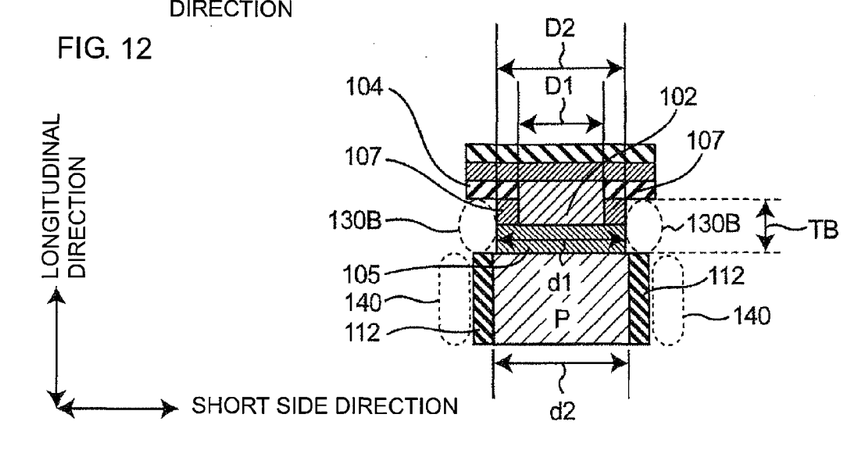
FIG. 12 is a longitudinal sectional view showing a vicinity of an upper top surface of a thermoelectric conversion element in FIG. 11 in an enlarged manner.

Next, referring to FIGS. 11 and 12, a thermoelectric conversion module according to a third embodiment will be described. FIG. 11 is a longitudinal sectional view showing a cross section structure of a thermoelectric conversion module 100C according to the third embodiment. FIG. 12 is a longitudinal sectional view showing a vicinity of an upper top surface of a p-type thermoelectric conversion element 110 in FIG. 11 in an enlarged manner, in which a portion indicated by being surrounding in FIG. 11 is enlarged.

As shown in FIG. 11, the thermoelectric conversion module 100C according to the third embodiment is characterized in that each stacked substrate 90C further includes conductive ring 107, as compared with the thermoelectric conversion module 100A according to the first embodiment. Each conductive ring 107 is provided between an interlayer insulating film 104 and a diffusion preventing film 105 in a longitudinal direction so as to surround a side surface of a jointing material 102 in a ring shape.

As shown in FIG. 12, an inner diameter dimension of the conductive ring 107 is larger than an inner diameter dimension D1 of an opening portion 104a. An outer diameter dimension D2 of the conductive ring 107 is smaller than an outer diameter dimension d1 of the diffusion preventing film 105 (D2<d1). This allows a gap 130B to be provided larger by a film thickness of the conductive ring 107. Thus, the thermoelectric conversion module 100C according to the third embodiment has the gap 130B that separates the tube 112 and the interlayer insulating film 104 in the longitudinal direction substantially at an interval of a film thickness TB of the diffusion preventing film 105 and the conductive ring 107.

As described above, in order to suppress inflow of heat to the tubes 112, 122, the outer diameter dimension D2 of the conductive ring 107 is smaller than the outer diameter dimension d1 of the diffusion preventing film 105 (D2<d1). On the other hand, in order to efficiently cause heat to flow in the p-type and n-type thermoelectric conversion portions 111, 121, the inner diameter dimension of the conductive ring 107 is larger than the inner diameter dimension D1 of the opening portion 104a. Moreover, in order to efficiently derive electric current generated in the p-type and n-type thermoelectric conversion portions 111, 121, it is preferable that the conductive ring 107 is made of a conductor having low electric resistance. A film thickness of the conductive ring 107 is, for example, 30 μm.

As to a manufacturing method, for example, the stacked substrate 90 shown in FIG. 5 is prepared to apply a resist film on the relevant stacked substrate 90, and form ring-shaped openings surrounding the opening portions 104a in the applied resist film. Subsequently, the conductors re embedded and formed in the formed openings, using a predetermined method to form the ring-shaped conductive ring 107. Subsequently, the applied resist film is peeled off from the stacked substrate 90. Other configurations, operation, and manufacturing methods are substantially similar to those in the first embodiment, and thus, detailed descriptions will be omitted.

As described above, the thermoelectric conversion module 100C according to the third embodiment further includes the conductive ring 107 each provided between the interlayer insulating film 104 and the diffusion preventing film 105 in the longitudinal direction so as to surround the side surface of the jointing material 102 in a ring shape. Thus, the thermoelectric conversion module 100C has the gap 130B between the tubes 112 and the interlayer insulating film 104 in the longitudinal direction, the gap 130B each separating the tube 112 and the interlayer insulating film 104 substantially at the interval of the film thickness TB of the diffusion preventing film 105 and the conductive ring 107. According to the above-described configuration, since the intervals 130B between the tubes 112 and the interlayer insulating film 104 in the longitudinal direction can be provided larger than the gap 130, inflow of heat to the tubes 112, 122 from the interlayer insulating film 104 can suppressed more. This can enhance thermoelectric conversion performance of the thermoelectric conversion module 100C more.

Moreover, when a heat source is, for example, a conductor, ionized liquid or the like, in view of prevention of a short circuit and galvanic corrosion, the configurations of the thermoelectric conversion modules 100A, 100C according to the first and third embodiments including the stacked substrates 90 are effective. Furthermore, when it is desired that the tubes 112 and the interlayer insulating film 104 are separated in the longitudinal direction larger and more surely, the configuration of the thermoelectric conversion module 100C having the gap 130B according to the third embodiment is more effective.

Embodiment 4

Figure 13:
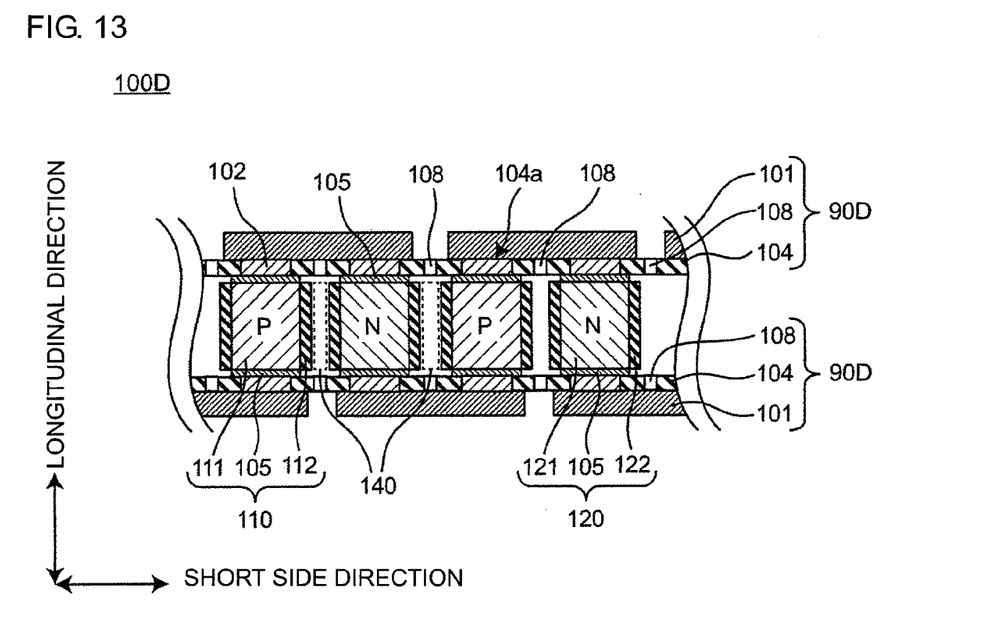
FIG. 13 is a longitudinal sectional view showing a cross section structure of a thermoelectric conversion module according to a fourth embodiment.

Next, referring to FIG. 13, a thermoelectric conversion module according to a fourth embodiment will be described. FIG. 13 is a longitudinal sectional view showing a cross section structure of a thermoelectric conversion module 100D according to the fourth embodiment.

As shown in FIG. 13, the thermoelectric conversion module 100D according to the fourth embodiment is characterized by further including holes 108 provided in an interlayer insulating film 104 of each stacked substrate 90D, as compared with the thermoelectric conversion module 100B according to the second embodiment.

The holes 108 are each a ring-shaped hole penetrating the interlayer insulating film 104 so as to surround a circumference of each of the opening portions 104a. The provision of the above-described holes 108 makes smaller a contact area between the tubes 112, 122 and the interlayer insulating film 104, which can more increase thermal resistance of heat paths from the interlayer insulating film 104 to the tubes 112, 122. Moreover, in view of strength of the thermoelectric conversion module 100D, it is preferable that a total sectional area of the holes 108 in a short side direction is 50% or less of a sectional area of the interlayer insulating film 104 in the short side direction. This is because if the total area of the holes 108 exceeds 50%, there are fears that influence of thermal deformation caused in the respective members cannot be absorbed in the interlayer insulating film 104, thereby deteriorating reliability as the thermoelectric conversion module.

As to a manufacturing method, after the stacked substrate 90B according to the above-described second embodiment is prepared similarly, for example, an etching process or the like is performed until the interlayer insulating film 104 is penetrated into a ring shape so as to surround the circumference of each of the opening portions 104a, which can form the holes 108 shown in FIG. 13. Other configurations, operation, and manufacturing methods are substantially similar to those in the second embodiment, and thus, detailed descriptions will be omitted.

As described above, the thermoelectric conversion module 100D according to the fourth embodiment includes the ring-shaped holes 108 penetrating the interlayer insulating film 104 so as to surround the circumferences of the opening portions 104a. The provision of the above-described holes 108 makes thermal resistance larger, which can more increase the thermal resistance of heat paths in which the heat flows from the interlayer insulating film 104 to the tube 112, 122. Furthermore, the supplied heat becomes difficult to be transmitted into a surface of the interlayer insulating film 104 with the holes 108 provided, so that the heat intensively flows in the flow path passing through the jointing material 102. As a result, the heat flowing to the p-type and n-type thermoelectric conversion portions 111, 121 increases. In this manner, providing the ring-shaped holes 108 surrounding the opening portions 104a can more strongly suppress the inflow of the heat into the surface of the interlayer insulating film 104, which can further enhance thermoelectric conversion efficiency of the thermoelectric conversion module 100D.

Embodiment 5

Figure 14:
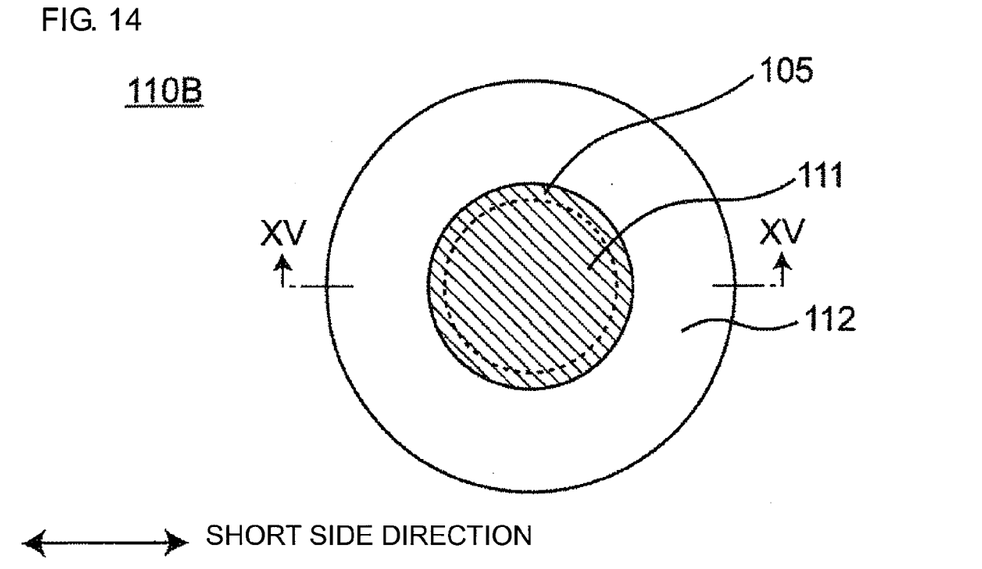
FIG. 14 is a plan view showing a planar structure of a thermoelectric conversion element according to a fifth embodiment.
Figure 15:
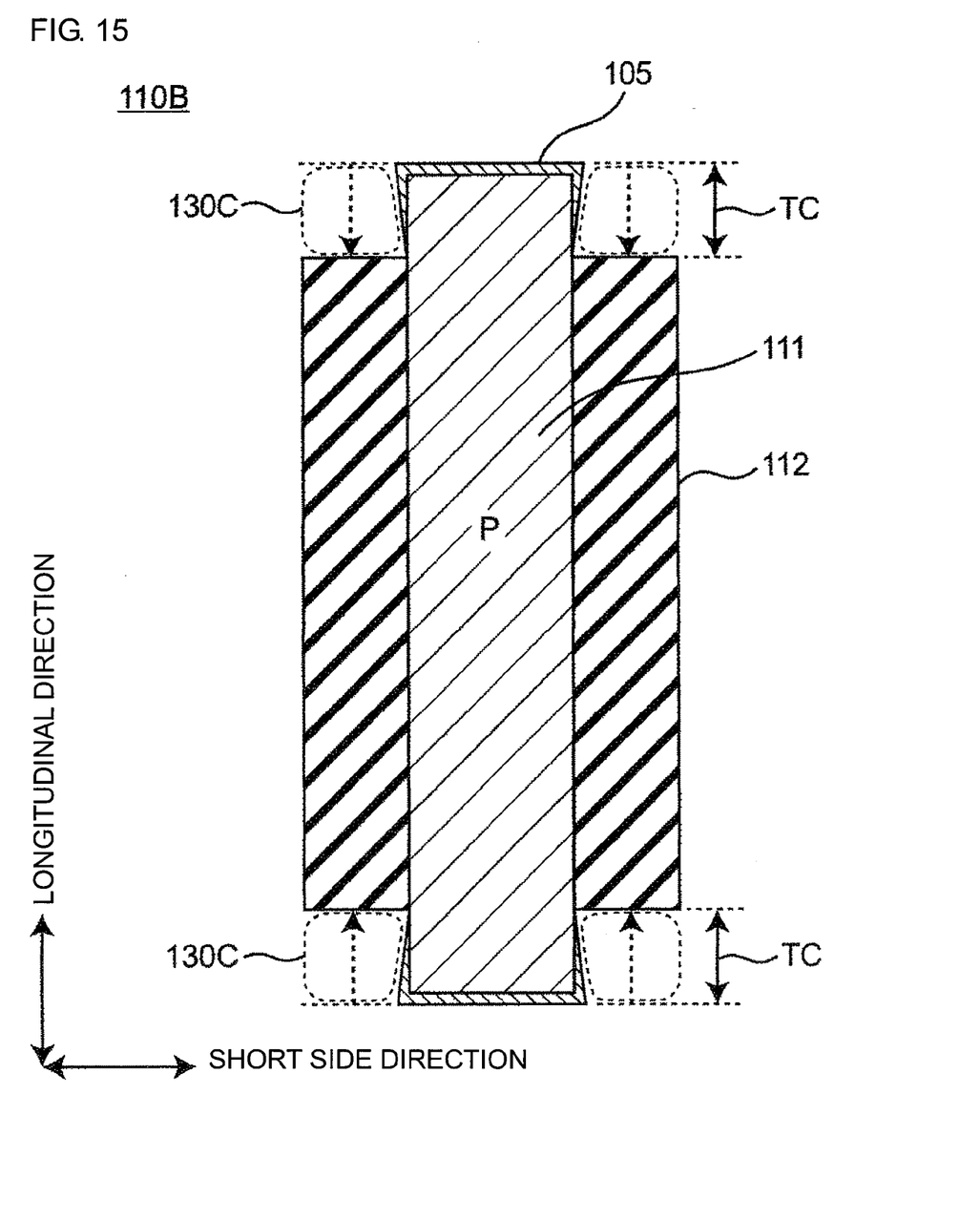
FIG. 15 is a longitudinal sectional view along XV-XV line in FIG. 14.

Next, referring to FIGS. 14 and 15, a thermoelectric conversion element and a thermoelectric conversion module according to a fifth embodiment will be described. FIG. 14 is a plan view showing a planar structure of a p-type thermoelectric conversion element 1108 according to the fifth embodiment. FIG. 15 is a longitudinal sectional view along XV-XV line in FIG. 14.

As shown in FIGS. 14 and 15, the p-type thermoelectric conversion element 1108 according to the fifth embodiment is characterized by having gap 130C in respective upper and lower side surfaces of a p-type thermoelectric conversion portion 111, as compared with the p-type thermoelectric conversion element 110 according to the first embodiment. These gap 130C are provided by projecting respective upper and lower top surfaces of the p-type thermoelectric conversion portion 111 in a projected shape from respective upper and lower top surfaces of a tube 112 in a longitudinal direction. Moreover, as shown in FIGS. 14, 15, diffusion preventing films 105 according to the fifth embodiment are provided so as to cover the respective top surfaces of the p-type thermoelectric conversion portion 111 projected from the respective upper and lower top surfaces of the tube 112, and each have a U-shaped cross section. While illustration is omitted, an n-type thermoelectric conversion element according to the fifth embodiment has a similar configuration, and has similar gap 130C in respective upper and lower side surfaces of an n-type thermoelectric conversion portion 121.

Moreover, while illustration is omitted, in each stacked substrate according to the fifth embodiment, an interlayer insulating film 104 is not used. Therefore, the thermoelectric conversion module according to the fifth embodiment has the gap 130C that separate the tubes (insulators) 112, 122 and a conductor (interconnecting layer) 101 in the longitudinal direction by similarly mounting the p-type and n-type thermoelectric conversion elements 1108, 120B on each of the stacked substrates 90 not having the interlayer insulating film 104, for example.

As to a manufacturing method, first, the p-type thermoelectric conversion portion 111 is formed, using a manufacturing process similar to the manufacturing process described in FIGS. 3 and 4. Subsequently, when the p-type thermoelectric conversion portion 111 is cut off from a pipe 201, as shown in FIG. 15, only the respective upper and lower top plates of the tube 112 are cut away to a central side by a thickness TC in the longitudinal direction, which allows the respective upper and lower top surfaces of the p-type thermoelectric conversion portion 111 to be projected.

Subsequently, on the respective upper and lower top surfaces of the projected p-type thermoelectric conversion portion 111, the diffusion preventing films 105 made of Ni or the like are selectively formed, for example, using a plating method to form the p-type thermoelectric conversion element 1108. A manufacturing process of the n-type thermoelectric conversion element is similar to the above-described manufacturing process of the p-type thermoelectric conversion element 1108. Thereafter, the formed p-type and n-type thermoelectric conversion elements are similarly mounted on the lower and lower stacked substrates 90 not having the interlayer insulating film 104, for example, to manufacture the thermoelectric conversion module according to the fifth embodiment. Other configurations, operation, and manufacturing methods are substantially similar to those in the first embodiment, and thus, detailed descriptions will be omitted.

As described above, the p-type and n-type thermoelectric conversion elements included by the thermoelectric conversion module according to the fifth embodiment have the gap 130C in the respective upper and lower side surfaces of the p-type and n-type thermoelectric conversion portions 111, 121. This can further suppress a heat flow of heat flowing in each of the tubes 112, 122, and can further increase a flow of heat flowing in each of the p-type and n-type thermoelectric conversion portions 111, 121, by which thermoelectric conversion efficiency can be increased.

In the above-described first to fifth embodiments, for example, Pyrex (registered trademark) of Corning Co., Ltd. in which the p-type thermoelectric conversion portion 111 has a thermal conductivity of 1.27 $W \cdot m^{-1} \cdot K^{-1}$, the n-type thermoelectric conversion portion 121 has a thermal conductivity of 1.35 $W \cdot m^{-1} \cdot K^{-1}$, and the tubes 112, 122 have a thermal conductivity of 1.1 W·m$^{-1}$·K$^1$ may be used. Moreover, in the p-type and n-type thermoelectric conversion portions 111, 121, for example, a cross-sectional area in the short side direction is 0.5 mm² (a column having a diameter 0.8 mm). Moreover, a cross-sectional area in the short side direction of the tube 112 is 0.28 mm² (a cylinder having an outer diameter of 0.5 mm), and a cross-sectional area in the short side direction of the tube 122 is 0.7 mm² (a cylinder having an outer diameter of 0.62 mm).

Moreover, in the above-described embodiments 1 to 5, since the examples in which the opening portions 104*a*, the diffusion preventing film 105, and the top surfaces of the p-type and n-type thermoelectric conversion portions 111, 122 are circular have been described, the outer diameter dimensions and the inner diameter dimensions have been used for description. However, these shapes may be other than the circular shape. In this case, as to sectional areas in the short side direction, a relationship may be employed, that the opening portions 104*a* are the smallest, the diffusion preventing films 105 are the second smallest, and the top surfaces of the p-type and n-type thermoelectric conversion portions 111, 122 are the largest. A configuration satisfying the above-described relationship allows the gap 130 to be similarly formed, which can suppress an inflow of heat to the tubes 112, 122.

Furthermore, in FIG. 13, the ring-shaped holes 108 penetrating the interlayer insulating film 104 have been described. However, the present invention is not limited to this, but for example, in each of the stacked substrates 90, ring-shaped holes penetrating the insulating plate 103 and the interlayer insulating film 104 may be each provided so as to surround the circumference of the opening portion 104*a*.

Moreover, the arbitrary embodiments of the foregoing embodiments can be combined as needed to thereby exert effects that the respective embodiments have.

The present disclosure can be widely applied to a thermoelectric conversion module that can convert heat to electricity.

DESCRIPTION OF REFERENCE SIGNS

90, 90B, 90C, 90D stacked substrate
100A, 100B, 100C, 100D thermoelectric conversion module
110, 110B p-type thermoelectric conversion element
111 p-type thermoelectric conversion portion
112, 122 tube
120 n-type thermoelectric conversion element
121 n-type thermoelectric conversion portion
101 conductor
102 jointing material
103 insulating plate
104 interlayer insulating film
105 diffusion preventing film
106 heat transfer body
107 conductive ring
130, 130B, 130C, 140 gap
201 pipe
202 silicon tube
203 cylinder
204 melting pot
205 molten thermoelectric conversion material

The invention claimed is:

1. A thermoelectric conversion module comprising one or more p-type thermoelectric conversion elements and one or more n-type thermoelectric conversion elements, the one or more p-type and n-type thermoelectric conversion elements being between a first stacked substrate and a second stacked substrate, wherein each p-type thermoelectric conversion element includes:
a columnar p-type thermoelectric conversion portion having a top surface, a bottom surface, and a side surface;
an insulator provided on the side surface of the p-type thermoelectric conversion portion, the insulator of the p-type thermoelectric conversion portion having a side surface facing the side surface of the p-type thermoelectric conversion portion, and the insulator of the p-type thermoelectric conversion portion having a top surface and a bottom surface that are different from the side surface of the insulator of the p-type thermoelectric conversion portion;
diffusion preventing films provided on the top surface and the bottom surface, respectively, of the p-type thermoelectric conversion portion, wherein a top surface of the diffusion preventing film that is on the top surface of the p-type thermoelectric conversion portion projects above the top surface of the insulator of the p-type thermoelectric conversion portion, and a bottom surface of the diffusion preventing film that is on the bottom surface of the p-type thermoelectric conversion portion projects below the bottom surface of the insulator of the p-type thermoelectric conversion portion;
a first gap directly above the top surface of the insulator of the p-type thermoelectric conversion portion, the first gap being directly sandwiched between the insulator of the p-type thermoelectric conversion portion and the first stacked substrate; and
a second gap directly below the bottom surface of the insulator of the p-type thermoelectric conversion portion, the second gap being directly sandwiched between the insulator of the p-type thermoelectric conversion portion and the second stacked substrate, each n-type thermoelectric conversion element includes:
a columnar n-type thermoelectric conversion portion having a top surface, a bottom surface, and a side surface;
an insulator provided on the side surface of the n-type thermoelectric conversion portion, the insulator of the n-type thermoelectric conversion portion having a side surface facing the side surface of the n-type thermoelectric conversion portion, and the insulator of the n-type thermoelectric conversion portion having a top surface and a bottom surface that are different from the side surface of the insulator of the n-type thermoelectric conversion portion;
diffusion preventing films provided on the top surface and the bottom surface, respectively, of the n-type thermoelectric conversion portion, wherein a top surface of the diffusion preventing film that is on the top surface of the n-type thermoelectric conversion portion projects above the top surface of the insulator of the n-type thermoelectric conversion portion, and a bottom surface of the diffusion preventing film that is on the bottom surface of the n-type thermoelectric conversion portion projects below the bottom surface of the insulator of the n-type thermoelectric conversion portion,
a third gap directly above the top surface of the insulator of the n-type thermoelectric conversion portion, the third gap being directly sandwiched between the insulator of the n-type thermoelectric conversion portion and the first stacked substrate; and
a fourth gap directly below the bottom surface of the insulator of the n-type thermoelectric conversion portion, the fourth gap being directly sandwiched between the insulator of the n-type thermoelectric conversion portion and the second stacked substrate,
each of the first and second stacked substrates includes:
an interconnecting layer that electrically connects the p-type thermoelectric conversion portion and the n-type thermoelectric conversion portion through the diffusion preventing films; and
a jointing material that joins the diffusion preventing films and the interconnecting layer,
each of the first and second stacked substrates further includes an interlayer insulating film provided between the diffusion preventing films and the interconnecting layer,
the interlayer insulating film has opening portions located on the diffusion preventing films,
the first gap is directly sandwiched between the insulator of the of the p-type thermoelectric conversion portion and the interlayer insulating film of the first stacked substrate,
the second gap is directly sandwiched between the insulator of the of the p-type thermoelectric conversion portion and the interlayer insulating film of the second stacked substrate,
the third gap is directly sandwiched between the insulator of the of the n-type thermoelectric conversion portion and the interlayer insulating film of the first stacked substrate, and
the fourth gap is directly sandwiched between the insulator of the of the n-type thermoelectric conversion portion and the interlayer insulating film of the second stacked substrate.

2. The thermoelectric conversion module according to claim 1, wherein
a sectional area of each of the diffusion preventing films in a direction substantially perpendicular to the side surfaces of the p-type and n-type conversion portions is larger than a sectional area of each of the opening portions in said direction, and
a sectional area of each of the top surfaces of the p-type and n-type thermoelectric conversion portions in said direction is larger than the sectional area of each of the diffusion preventing films in said direction.

3. The thermoelectric conversion module according to claim 1, wherein
each of the first and second stacked substrates further includes a conductive ring that surrounds a side surface of the respective jointing material.

4. The thermoelectric conversion module according to claim 1, wherein
each of the first and second stacked substrates further includes ring-shaped holes each penetrating the respective interlayer insulating film so as to surround a circumference of each of the opening portions.

5. The thermoelectric conversion module according to claim 4, wherein
a total area of sectional areas of the holes is 50% or less of a sectional area of the interlayer insulating film.

6. The thermoelectric conversion module according to claim 1, wherein
surface roughness of the interlayer insulating film is larger than surface roughness of the insulators.

7. The thermoelectric conversion module according to claim 6, wherein a difference between the surface roughness of the interlayer insulating film and the surface roughness of the insulators is 80 µm or more.

8. The thermoelectric conversion module according to claim 1, wherein
the p-type and n-type thermoelectric conversion portions contain a Bi—Te based material,
the insulators contain heat-resistant glass or quartz, and
the interlayer insulating film contains an imide compound or acrylic resin.

9. The thermoelectric conversion module according to claim 1, wherein
each shape of cross sections of the diffusion preventing films, the p-type and n-type thermoelectric conversion portions, and the opening portions is circular, and
an outer diameter dimension of the diffusion preventing films is smaller than an outer diameter dimension of the p-type and n-type thermoelectric conversion portions, and an inner dimension of the opening portions is smaller than the outer diameter dimension of the diffusion preventing films.

10. The thermoelectric conversion module according to claim 1, wherein
the top surface of the p-type thermoelectric conversion portion projects above the top surface of the insulator of the p-type thermoelectric conversion portion,
the top surface of the n-type thermoelectric conversion portion projects above the top surface of the insulator of the n-type thermoelectric conversion portion,
the bottom surface of the p-type thermoelectric conversion portion projects below the bottom surface of the insulator of the p-type thermoelectric conversion portion,
the bottom surface of the n-type thermoelectric conversion portion projects below the bottom surface of the insulator of the n-type thermoelectric conversion portion,
the p-type and n-type thermoelectric conversion elements have a gap in upper and lower side surfaces of the p-type and n-type thermoelectric conversion portions.

11. The thermoelectric conversion module according to claim 1, further comprising a fifth gap that separates adjacent p-type and n-type thermoelectric conversion elements.

12. The thermoelectric conversion module according to claim 1, wherein
the first, second, third, and fourth gaps are filled with decompressed gas.

13. The thermoelectric conversion module according to claim 1, wherein
the first, second, third, and fourth gaps are filled with argon.

* * * * *